US005579272A

United States Patent [19]
Uchida

[11] Patent Number: 5,579,272
[45] Date of Patent: Nov. 26, 1996

[54] SEMICONDUCTOR MEMORY DEVICE WITH DATA COMPRESSION TEST FUNCTION AND ITS TESTING METHOD

[75] Inventor: Toshiya Uchida, Kawasaki, Japan

[73] Assignee: Fujitsu Limited, Kawasaki, Japan

[21] Appl. No.: 563,797

[22] Filed: Nov. 28, 1995

[30] Foreign Application Priority Data

Mar. 15, 1995 [JP] Japan .................................. 7-056370

[51] Int. Cl.⁶ .............................. G11C 7/00; G11C 29/00
[52] U.S. Cl. ..................... 365/201; 365/189.07; 371/21.2
[58] Field of Search ............................... 365/189.07, 201, 365/230.03, 21.1, 21.2

[56] References Cited

U.S. PATENT DOCUMENTS

| | | | |
|---|---|---|---|
| 5,016,220 | 5/1991 | Yamagata | 365/201 |
| 5,355,342 | 10/1994 | Ueoka | 365/201 |
| 5,400,281 | 3/1995 | Morigami | 365/201 |
| 5,428,575 | 6/1995 | Fudeyasu | 365/201 |
| 5,483,493 | 1/1996 | Shin | 365/201 |

*Primary Examiner*—David C. Nelms
*Assistant Examiner*—Son Mai
*Attorney, Agent, or Firm*—Staas & Halsey

[57] ABSTRACT

The inputs of matching detection circuits $4i$ ($i=0$ to 3) is connected with each of one-bit data lines to one of a plurality of memory blocks 10 to 13, with its output connected to data terminal $2i$. The input of distribution circuit $3i$ are connected to the data terminal $2i$ and its plurality of outputs, which are insulated from one another and output data corresponding to the data provided to the inputs are connected to the data lines that are connected to the inputs of the matching detection circuit $4i$. A control circuit 16 that, during a data write in data compression test mode, invalidates the output from the matching detection circuit $4i$ to the data terminal $2i$ and validates outputs from the distribution circuit $3i$ to the data lines, and during a data read in the the data compression test mode, validates the output from the matching detection circuits $4i$ to the data terminal $2i$ and invalidates the outputs from the distribution circuits $3i$ to the data lines.

7 Claims, 10 Drawing Sheets

BL0 *BL0 BL1 *BL1

▨ : MEMORY CELL SET TO '1'
☐ : MEMORY CELL SET TO '0'

BL0 *BL0 BL1 *BL1

SEMICONDUCTOR MEMORY DEVICE WITH DATA COMPRESSION TEST FUNCTION AND ITS TESTING METHOD

BACKGROUND OF THE INVENTION

The present invention relates to a semiconductor memory device provided with a data compression test function and its testing method.

With the trend toward higher integration for semiconductor memory devices, the time required for their memory tests has been increasing. If the memory capacity increases four times, for instance, the testing time will be quadrupled, too. In addition, if the number of bits in one word in a semiconductor memory device is high, the number of semiconductor memory devices that can be tested simultaneously on one testing apparatus becomes restricted. Thus, in order to reduce the testing time by increasing the simultaneous testing capacity, there are semiconductor memory devices provided with a data compression test function.

FIG. 6 shows the principle structure of a semiconductor memory device of this type in the prior art.

This semiconductor memory device is provided with memory blocks 10 to 13 which are all structured identically. Address specification is made by a row decoder 14 and a column decoder 15, which are commonly shared by the memory blocks 10 to 13. RA is a row address and CA is a column address. FIG. 7 shows the structure of the memory block 10.

During a data write in the memory test mode, four-bit data are provided to input/output terminals 20 to 23 in a state in which the outputs from distribution circuits 30 to 33 are validated and the output of matching detection circuits 40 to 43 are invalidated (at high impedance, for instance) by a control circuit 16. The data provided to the input/output terminals 20 to 23 are reproduced into identical four-bit data by distribution circuits 30 to 33 respectively, and then are written in the memory blocks 10 to 13 respectively. The outputs from the distribution circuits 30 to 33 are insulated from one another. In the memory block 10, the identical data on data lines D0 to D3 shown in FIG. 7, are provided to a memory cell array 101 via a column select switch circuit 103 and a sense amplifier 102 and are written over 4 columns, selected by the column decoder 15, in one row, selected by the row decoder 14.

During a data read in the memory test mode in FIG. 6, four-bit data are read out from the memory blocks 10 to 13 in a state in which the output of the distribution circuits 30 to 33 are set at high impedance and are then taken out at the data input/output terminals 20 to 23 via the matching detection circuits 40 to 43. In the memory block 10, one row in the memory cell array 101 shown in FIG. 7 is selected by the row decoder 14, its memory contents are provided to the column select switch circuit 103 via the sense amplifier 102, four bits in the one row are selected by the column decoder 15 and are provided to the matching detection circuit 40 via the data lines D0 to D3. During this operation, if the logical levels of the data lines D0 to D3 do not match, an NG decision is made for these four bits.

In a data compression test such as described above, it is possible to reduce the testing time, since, while there are four bits in one word, the test itself can be performed in units of sixteen bits.

FIG. 8 shows part of FIG. 7 in detail. In FIG. 7, for the sake of simplification, each data line is shown as a single line, in reality the data lines are doubled, as shown in FIG. 8, with D0 to D3 and *D0 to *D3, through which mutually complementary data are provided. Reference signs C000 to C131 indicate memory cells while reference characters T000 to T131 indicate transfer gates. Word lines WL00 to WL03 are connected to word lines WL 10 to WL13 respectively.

During a data write in the memory test mode, when the word lines WL00 and WL10 are selected by the row decoder 14 to turn ON the transfer gates T000, T001, T100 and T101 and the column line CL is selected by the column decoder 15 to turn ON the column select switch circuits 1030 and 1031, the data on the data lines Di and *Di (i=0 to 3) are amplified by a sense amplifier 102$i$ and provided to the bit lines BLi and *BLi and the data on the bit lines BL0 to BL3 are written in the memory cells C000, C001, C100 and C101 respectively. Likewise, when the word lines WL01 and WL11 and the column line CL are selected, the data on the data lines D0 to D3 are written in the memory cells C010, C011, C110 and C111 respectively, when the word lines WL02 and WL12 and the column line CL are selected, the data on the data lines *D0 to *D3 are written in the memory cells C020, C021, C120 and C121 respectively and when the word lines WL03 and WL13 and the column line CL are selected, the data on the data lines *D0 to *D3 are written in the memory cells C030, C031, C130 and C131 respectively.

The data lines D0 to D3 are set to "1" (the data lines *D0 to *D3 are set to "0"), the column line CL is selected and then the word lines are selected sequentially. Identical processing is repeated for the other columns. This makes the test memory pattern in the memory cell array look as shown in FIG. 9A. The hatched rectangles in the figure are memory cells set to "1" while the unhatched rectangles are memory cells set to "0".

With this memory pattern, it is possible to detect a failure caused by the interference among memory cells that may occur when an electric charge leaks from the memory cells that are set to "1" into the memory cells that are set to "0", which are surrounded by memory cells set to "1", causing the memory cells that have been set to "0" to be switched to "1". A test can be performed in an identical manner in a reverse pattern in which "0" and "1" are reversed.

With the memory pattern shown in FIG. 9A, since the bit lines BL0, BL1, . . . are set to "1" in sequence, and not to "0", it is not possible to detect a failure caused by interference between memory cells and the bit lines, such as the memory cell C000 changing from "1" to "0" with the electric charge in the memory cell C000 leaking to the bit line BL0 in a state in which "1" has been written in the memory cell C000, the transfer gate T000 has been turned OFF and the bit line BL0 has been set to "0" in FIG. 8. This test can be performed while forming the memory pattern shown in FIG. 9B. For instance, the column line CL is selected to execute the following processing in sequence:

(1) selecting the word line WLD00 with D0="1" & D1="0"

(2) selecting the word line WLD01 with D0="1" & D1="0"

(3) selecting the word line WLD02 with D0="0" & D1="1"

(4) selecting the word line WLD03 with D0="0" & D1="1"

BL0="0" when (3) and (4) above are performed, and interference between the memory cell C000 and the bit line BL0 and interference between the memory cell C010 and the bit line BL0 can be tested.

However, since, in the processing described above, the data compression method in the prior art, which has identical data on the data lines D0 to D4, cannot be employed, the test must be performed in the non-compression, normal operating mode, and the length of testing time becomes increased.

SUMMARY OF THE INVENTION

Accordingly, the object of the present invention is to provide a semiconductor memory device with a data compression test function, and its testing method, which make it possible to perform data compression tests for more diverse memory patterns by addressing the problems discussed above.

FIG. 1 shows one mode of the principle structure of the semiconductor memory device with a data compression function according to the present invention. FIG. 1 shows a case in which a number of memory blocks is 4, a number of data input/output terminals is 4 and a data compression factor is 4. The present invention is described by quoting the corresponding reference characters in FIG. 1.

According to the first aspect of the invention, there is provided a semiconductor memory device including memory blocks, data terminal for data input/output and data lines for said memory blocks, said device comprising: a matching detection circuit having inputs and an output coupled to said data terminal, each of said inputs being coupled to one of said data lines, said one corresponding to one of said memory blocks; a distribution circuit having an input coupled to said data terminal and having outputs for outputting data corresponding to data provided to said input of said distribution circuit, said outputs of said distribution circuit being insulated from each other and coupled to said inputs of said matching detection circuit respectively; and a control circuit for invalidating said output of said matching detection circuit and validating said outputs of said distribution circuit during a data write in a data compression test mode, and for validating said output of said matching detection circuit and invalidating said outputs of said distribution circuit during a data read in said data compression test mode.

With the first aspect of the invention, since a plurality of bits that are subordinate to one another is prevented from being written In each memory block and data is written with one bit distributed to each of a plurality of memory blocks, more diverse memory patterns can be written using compressed data, and data that are written in the plurality of memory blocks can be read out compressed. Consequently, various types of tests that correspond to various failures to be detected can be performed quickly.

In the first mode of the first aspect of the invention, said distribution circuit includes: switch elements commonly coupled at first side ends thereof as said input of said distribution circuit and at the second ends thereof to said outputs of said distribution circuit.

In the second mode of the first aspect of the invention, said distribution circuit further includes: bidirectional buffer gates coupled at first side ends thereof to said second ends of said switch elements respectively, the second ends thereof being as said outputs of said distribution circuit.

In the third mode of the first aspect of the invention, as shown in FIG. 5 for example, a plurality of said data terminals are provided and said distribution circuit includes: first switch elements commonly coupled at first side ends thereof and at the second ends thereof to said outputs of said distribution circuit respectively; and second switch elements coupled at first side ends thereof to said second ends of said first switch elements respectively and at the second ends thereof to said data terminals respectively.

In the fourth mode of the first aspect of the invention, said distribution circuit further includes: bidirectional buffer gates coupled at first side ends thereof to said second ends of said second switch elements respectively and at the second ends thereof to said data terminals respectively.

In the fifth mode of the first aspect of the invention, a plurality of said data terminals, said matching detection circuits and said distribution circuits are provided.

According to the second aspect of the invention, there is provided a compression testing method for the semiconductor memory device, comprising the steps of: invalidating said output of said matching detection circuit and validating said outputs of said distribution circuit during a data write in a data compression test mode; and validating said output of said matching detection circuit and invalidating said outputs of said distribution circuit during a data read in said data compression test mode.

With the second aspect of the invention, through the above reason, various types of tests that correspond to the various failures to be detected, can be performed quickly.

DESCRIPTION OF THE PREFERRED EMBODIMENTS

FIRST EMBODIMENT

Figure 1:
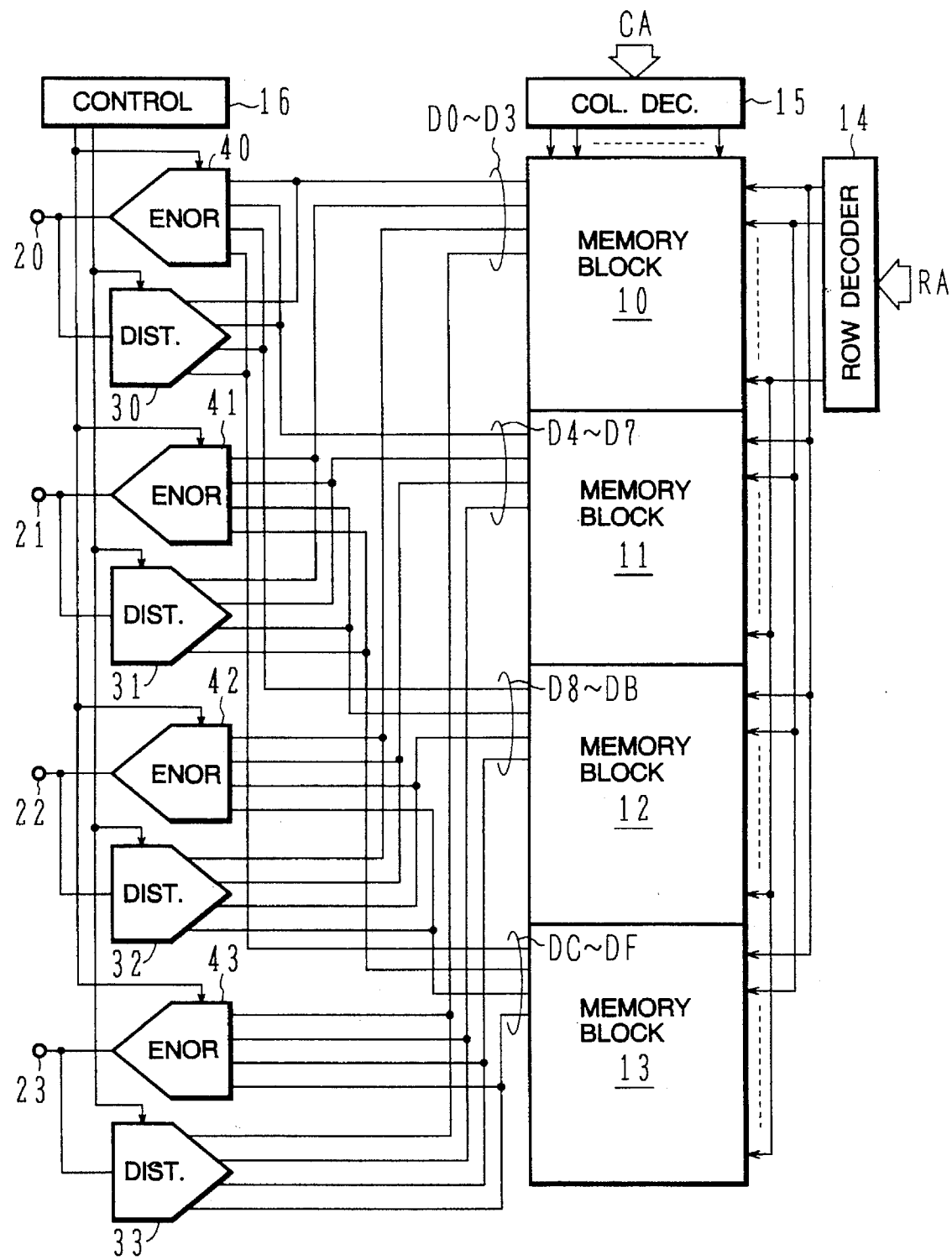
FIG. 1 is a block diagram of one mode of the principle structure of the semiconductor memory device with a data compression function according to the present invention.
Figure 2:
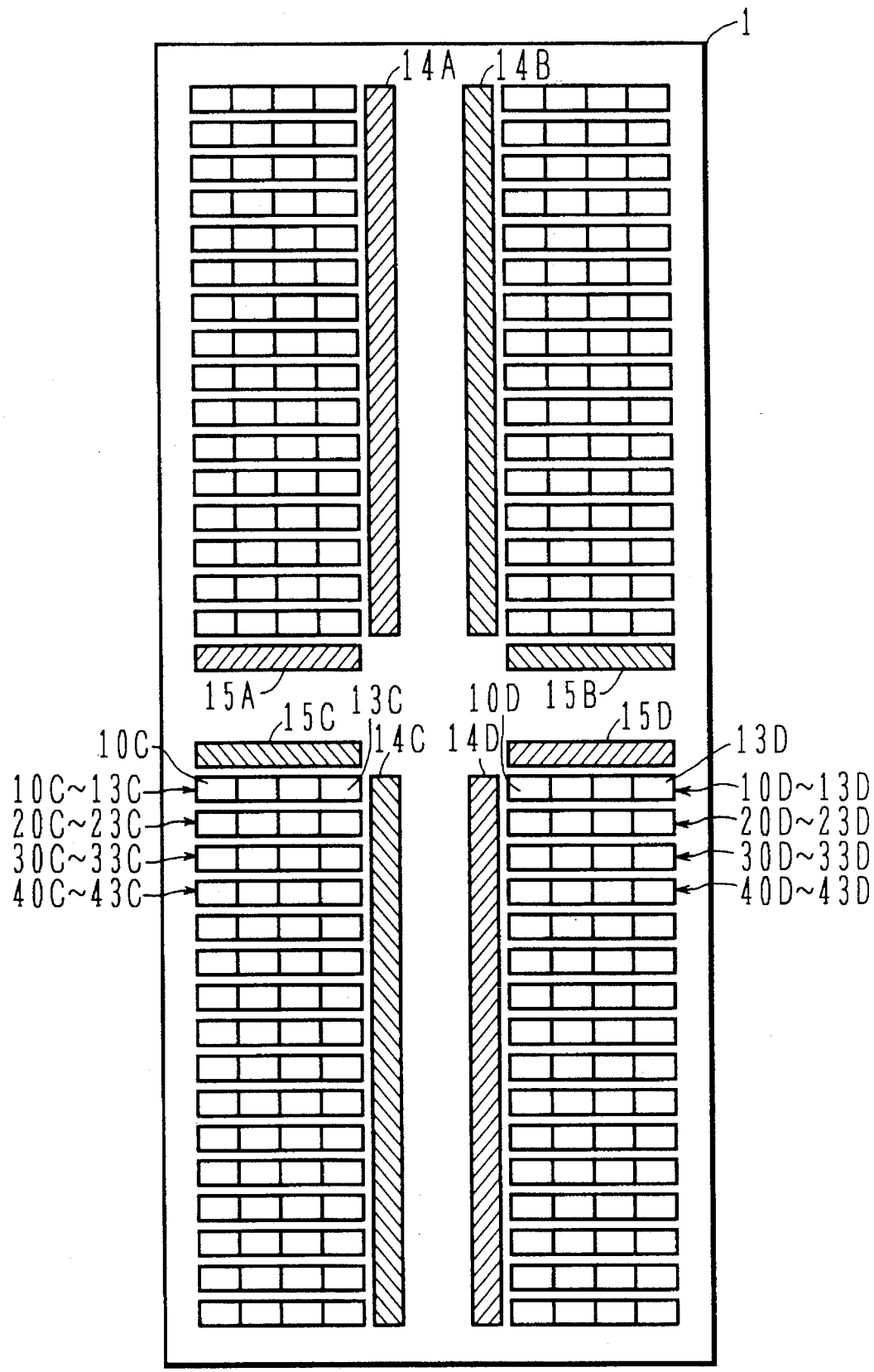
FIG. 2 is a schematic block pattern diagram of the DRAM in the first embodiment according to the present invention.

FIG. 2 is a schematic block pattern of a DRAM 1 with, for instance, 16M words×1 bit.

Figure 7:
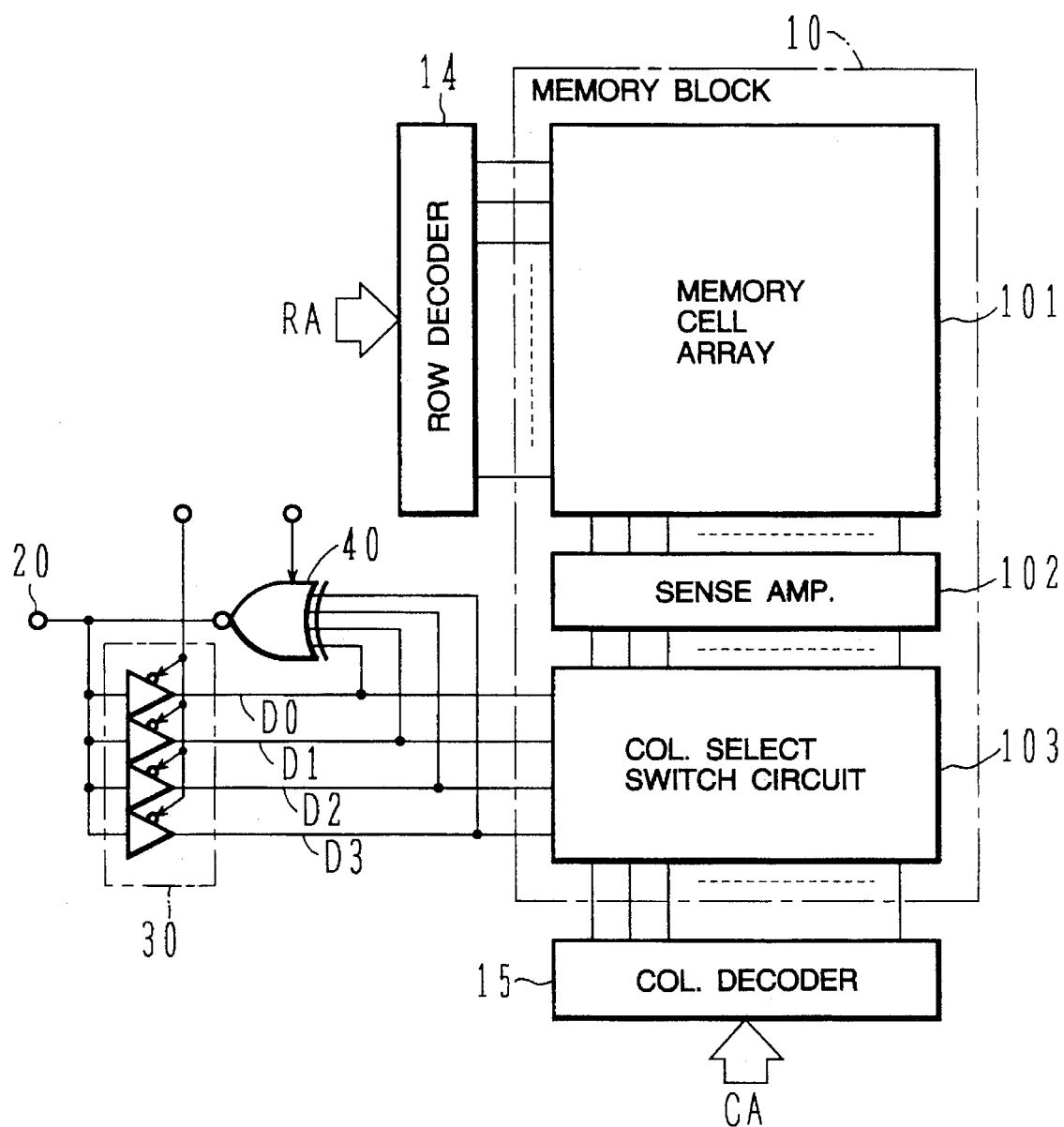
FIG. 7 is a block diagram of the structure of part of FIG. 6.
Figure 8:
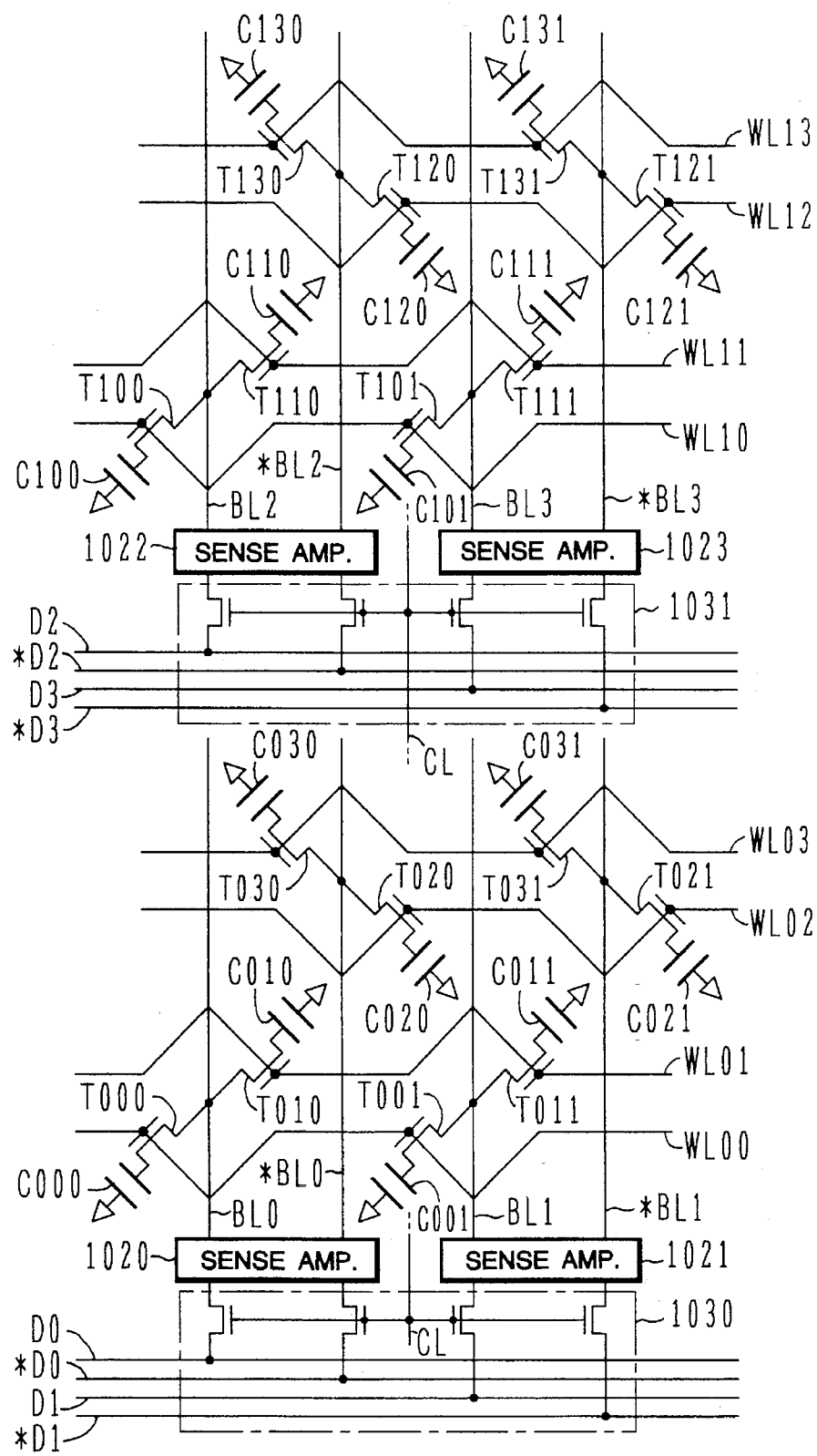
FIG. 8 is a detailed circuit diagram of part of FIG. 7.

Reference signs 14A to 14D indicate row decoders while reference characters 15A to 15D indicate column decoders, and reference characters 10C to 13C, 20C to 23C, . . . indicate memory blocks with 64K bits each. Each of those memory blocks is the same as shown in FIG. 7.

Figure 3:
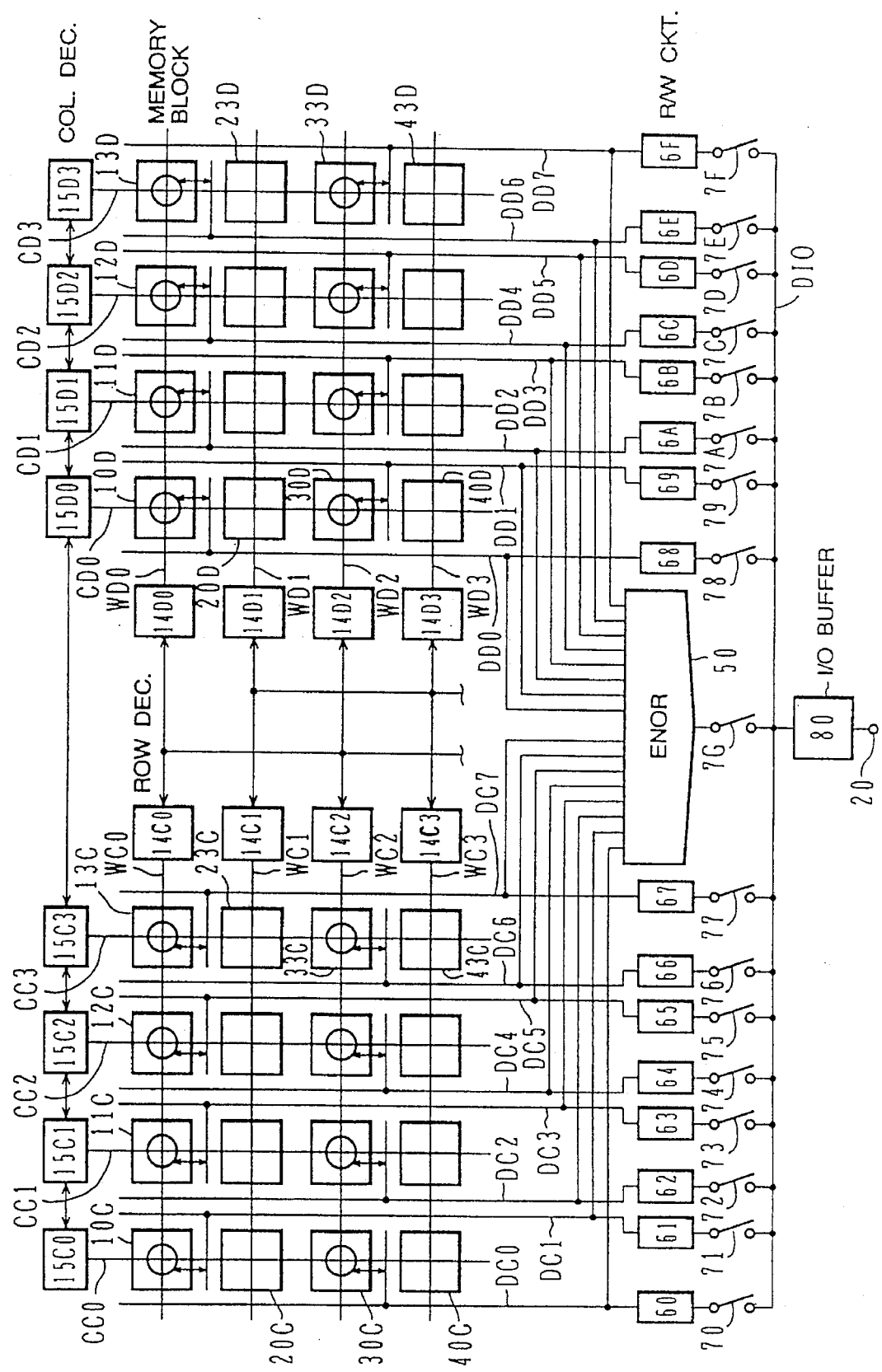
FIG. 3 is a schematic block diagram of the structure of part of FIG. 2.

FIG. 3 shows a schematic structure of part of FIG. 2. In FIG. 3, row decoders 14C0 to 14C3 constitute part of the row decoder 14C shown in FIG. 2 and the row decoders 14D0 to 14D3 constitute part of the row decoder 14D shown in FIG. 2 while column decoders 15C0 to 15C3 constitute part of the column decoder 15C shown in FIG. 2 and column decoders 15D0 to 15D3 constitute part of the column decoder 15D shown in FIG. 2. The circular marks indicate representative memory cells in the memory blocks and in correspondence to these, column lines CC0 to CC3 and CD0 to CD3 and word lines WC0 to WD3 are all represented as single lines. In FIG. 3, some of the reference characters assigned to the memory blocks are omitted.

The memory cells in corresponding rows in the memory blocks 10C to 13C, 30C to 33C, 10D to 13D and 30D to 33D are simultaneously selected by the row decoders 14C0, 14C2, 14D0 and 14D2 via the word lines WC0, WC2, WD0 and WD2 respectively. The corresponding single columns in those selected rows, are then simultaneously selected by the column decoders 15C0 to 15C3 and 15D0 to 15D3 via the column lines CC0 to CC3 and CD0 to CD3 respectively. Thus, the one bit in each of the memory blocks 10C to 13C, 30C to 33C, 10D to 13D and 30D to 33D at a position that corresponds to the positions of the rest of the selected bits, is selected at the same time as the rest.

The bit selection described above for the group of memory blocks 10C to 13C, 30C to 33C, 10D to 13D and 30D to 33D and the bit selection for the group of memory blocks 20C to 23C, 40C to 43C, 20D to 23D and 40D to 43D are performed independently of each other and while bit selection is performed in one group, bit selection is not performed in the other group.

During a data read, the data at the selected bits in the memory blocks 10C to 13C, 30C to 33C, 10D to 13D and 30D to 33D are taken out on the data lines DC1, DC3, DC5, DC7, DC0, DC2, DC4, DC6, DD0, DD2, DD4, DD6, DD1, DD3, DD5 and DD7 respectively. While an identical operation is performed when bit selection is made for the group of memory blocks 20C to 23C, 40C to 43C, 20D to 23D and 40D to 43D, for the sake of simplification, the connection relationships in the data flow in that situation is omitted in FIG. 3.

The data lines DC0 to DC7 are each connected to read/write circuits 60 to 67, which are bidirectional buffer gates, respectively at first side ends, while the other ends of the read/write circuits 60 to 67 are connected to one end of an input/output buffer gate 80, via switch elements 70 to 77 respectively. The data lines DD0 to DD7 are connected to read/write circuits 68, 69, 6A to 6F respectively at one side ends, while the other ends of the read/write circuits 68 to 6F are connected to the end of an input/output buffer gate 80 via switch elements 78 to 7F respectively. The data lines DC0 to DC7 and DD0 to DD7 are also connected to inputs of a matching detection circuit 50, whose output is connected to one end of the input/output buffer gate 80 via a switch element 7G. The other end of the input/output buffer gate 80 is connected to a data input/output terminal 20. The matching detection circuit 50 is ENOR gate or EOR gate.

Although normally, a data input terminal and a data output terminal will be connected to the input/output buffer gate 80, for the sake of simplification, FIG. 3 shows one data input/output terminal 20 connected.

Figure 10A:
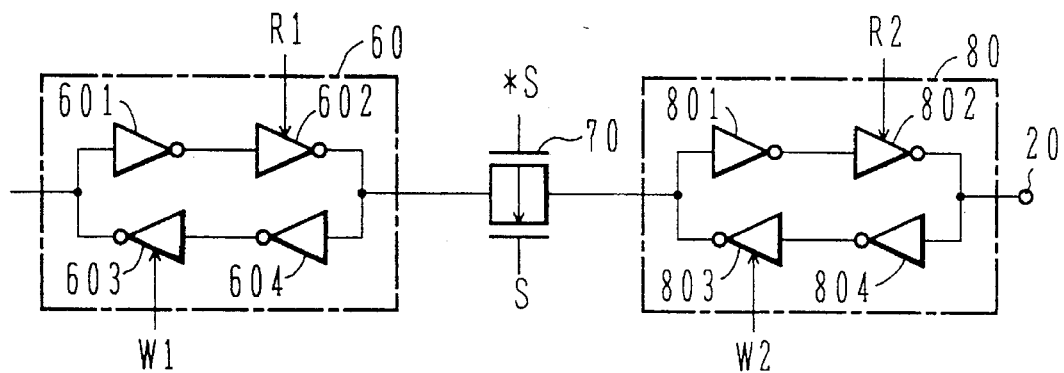
FIG. 10A shows the structure example of read/write circuit, switch element and input/output buffer gate in FIG. 3.

FIG. 10A shows the structure example of read/write circuit 60, switch element 70 and input/output buffer gate 80. Reference characters 601 to 604 and 801 to 804 are inverters and the inverters 602, 603, 802 and 803 are three state buffers controlled by control signals R1, W1, R2 and W2, respectively. The read/write circuit 60 is set in the direction for data write when R1 is low and W1 is high, and in the direction for data read when R1 is high and W1 is low. The input/output buffer gate 80 is set as the same as the read/write circuit 60. The switch element 70 have nMOSFET and pMOSFET connected parallel to each other, the gates of which are controlled by complementary control signals S and *S respectively. The switch element 70 is turned on when S is high and *S is low, and turned off when S is low and *S is high.

Next, the operation of the DRAM structured as explained above is explained in reference to FIG. 3.

During a data write in the data compression test mode, the switch elements 70 to 7F are turned ON while the switch element 7G is turned OFF and the bidirectional read/write buffer circuits 60 to 6F and input/output buffer gate 80 are set in the direction for data write. The one-bit data provided to the data input/output terminal 20 travel through the input/output buffer gate 80 to become identical sixteen-bit data and then travel through the switch elements 70 to 7F, the read/write circuits 60 to 6F and the data lines DC0 to DC7 and DD0 to DD7 to be written in the memory blocks 10C to 13C, 30C to 33C, 10D to 13D and 30D to 33D at the selected bits mentioned earlier.

Figure 9A:
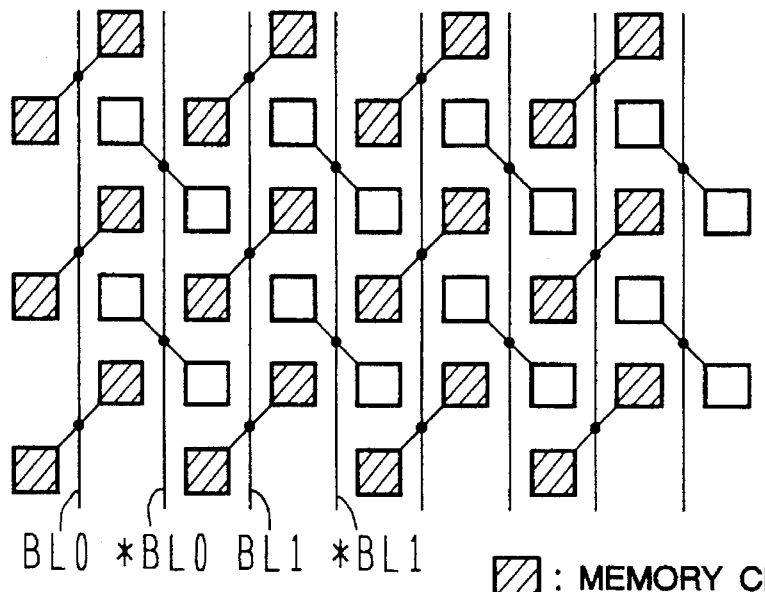
FIGS. 9A and 9B shows test memory patterns in the memory cell array.
Figure 9B:
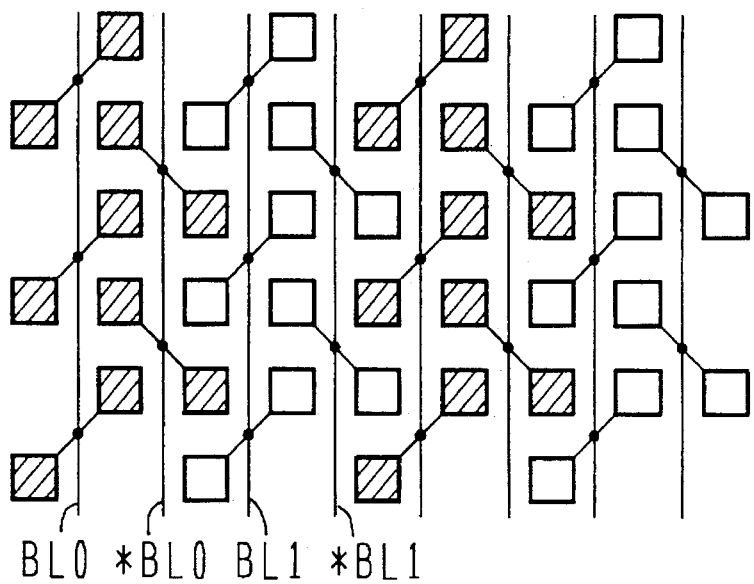

Since a maximum of 1 bit is written in one memory block at a time, by performing the write repeatedly, patterns such as those shown in FIG. 9A and FIG. 9B can be written in each of the memory blocks 10C to 13C, 30C to 33C, 10D to 13D and 30D to 33D. As a result, the time required for testing is reduced, compared to what is required in the prior art.

During a data read in the memory data compression test mode, the switch elements 70 to 7F are turned OFF while the switch element 7G is turned ON and the bidirectional buffer gate 80 is set in the direction for data read. The bits selected in the manner described above in the memory blocks 10C to 13C, 30C to 33C, 10D to 13D and 30D to 33D are provided to the matching detection circuit 50 through the data lines DC0 to DC7 and DD0 to DD7. The output voltage of the matching detection circuit 50 is high when the bit data on the data lines DC0 to DC7 and DD0 to DD7 are identical, but is low when there are one or more bits that do not match. The output from the matching detection circuit 50 is taken out at the data input/output terminal 20 via the switch element 7G and the input/output buffer gate 80. If the data input/output terminal 20 is at low voltage, i.e., if the read data are different from those at the time of the write, a decision is made that there is a memory cell failure in units of 16 read out bits.

During a data write in the normal operating mode, one of the switch elements 70 to 7F, i.e., the switch element 7i, is selected by either the column decoder 15C or the column decoder 15D (with a signal via wiring not shown in the figure) and the input/output buffer gate 80 and the read/write circuit 6i are set in the direction for write. The one-bit data provided to the data input/output terminal 20 travel through the input/output buffer gate 80, the switch element 7i and the read/write circuit 6i to be written at the one bit selected in one of the memory blocks 10C to 13C, 30C to 33C, 10D to 13D and 30D to 33D.

During a data read in the normal operating mode, one of the switch elements 70 to 7F, i.e., the switch element 7i, is selected by either the column decoder 15C or the column decoder 15D and the input/output buffer gate 80 and the read/write circuit 6i are set in the direction for read. The data at the one bit selected in one of the memory blocks 10C to 13C, 30C to 33C, 10D to 13D and 30D to 33D travel through the read/write circuit 6i, the switch element 7i and the input/output buffer gate 80 to be taken out at the data input/output terminal 20.

Figure 10B:
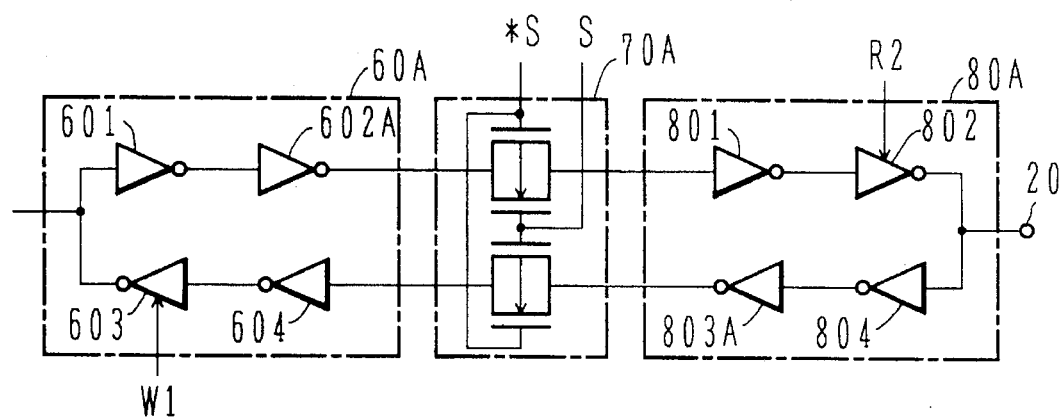
FIG. 10B shows a variation corresponding to FIG. 10A.

FIG. 10B shows a variation corresponding to FIG. 10A. An inverter 602A of a read/write circuit 60A and an inverter 803A of an input/output buffer gate 80A are not three state buffers. A switch element 70A consists of two transfer gates, one of which is connected between the output of the inverter 602A and the input of the inverter 801 and the other of which is connected between the output of the inverter 803A and the input of the inverter 604. The control signals R2 and W1 are set to high and low respectively when reading data, and low and high respectively when writing data.

Figure 10C:
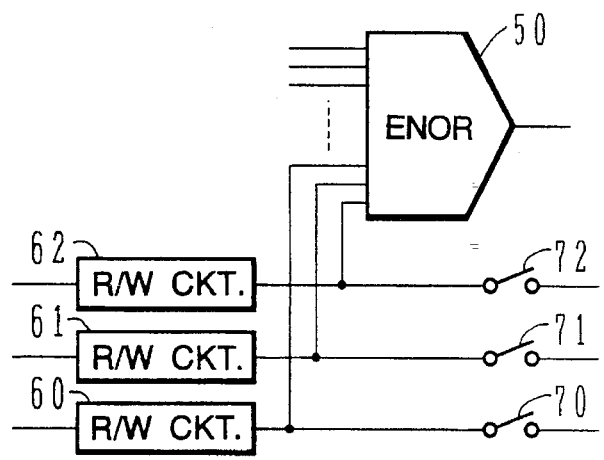
FIG. 10C shows another variation corresponding to part of FIG. 3.

FIG. 10C shows another variation corresponding to part of FIG. 3. The inputs of matching detection circuit 50 are connected between the read/write circuits 60, 61, 62, ... and the switch elements 70, 71, ... respectively. In this variation, the switch elements 70, 71, ... constitute a distribution circuit.

SECOND EMBODIMENT

Figure 4:
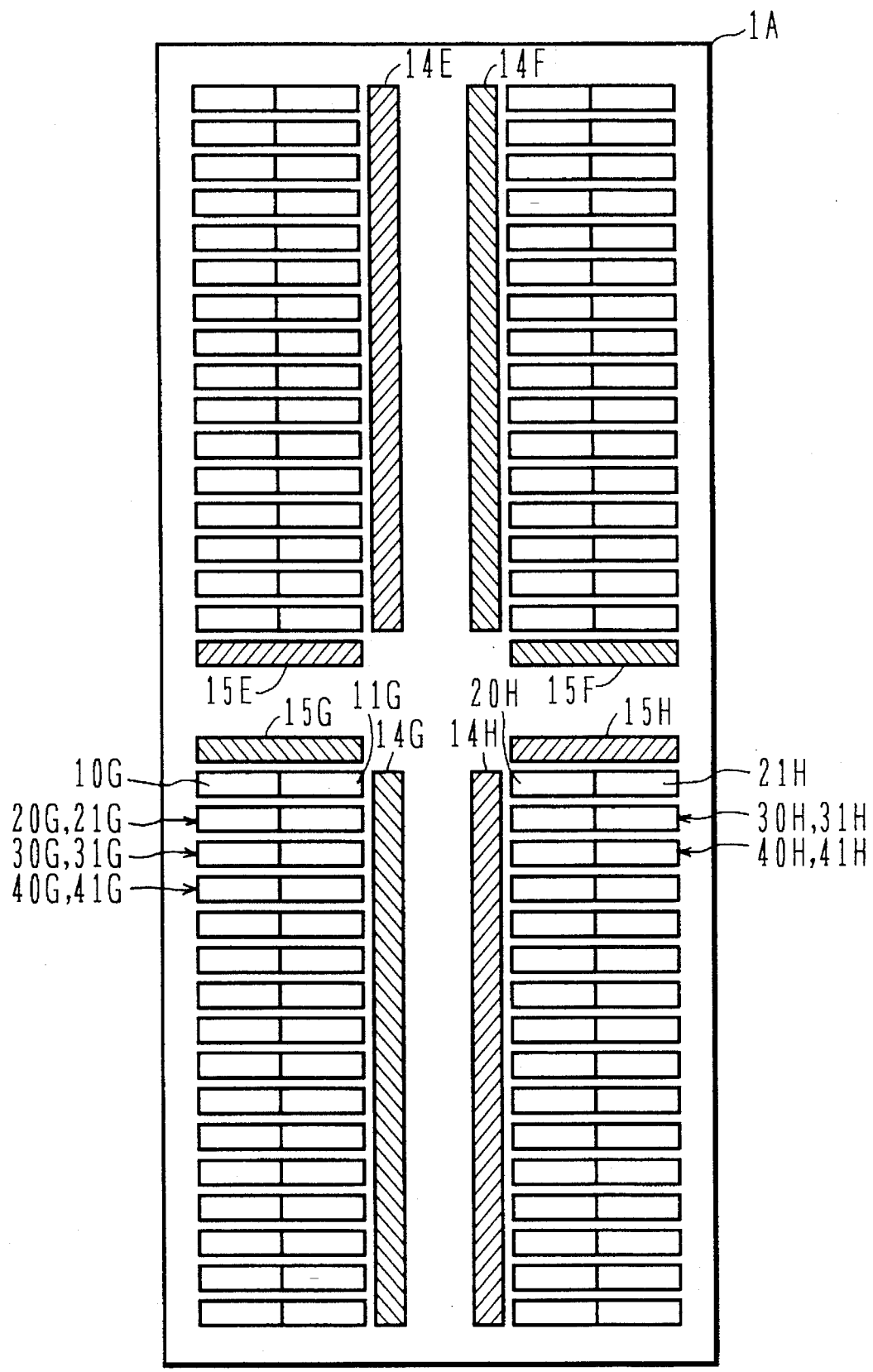
FIG. 4 is a schematic block pattern diagram of the DRAM in the second embodiment according to the present invention.

FIG. 4 is a schematic block pattern of a DRAM 1A with, for instance, 1M word×sixteen bits.

Reference signs 14E to 14H indicate row decoders, reference characters 15E to 15H indicate column decoders, and reference characters 10G, 11G, 20G, 21G, . . . indicate memory blocks with 128K bits each.

Figure 5:
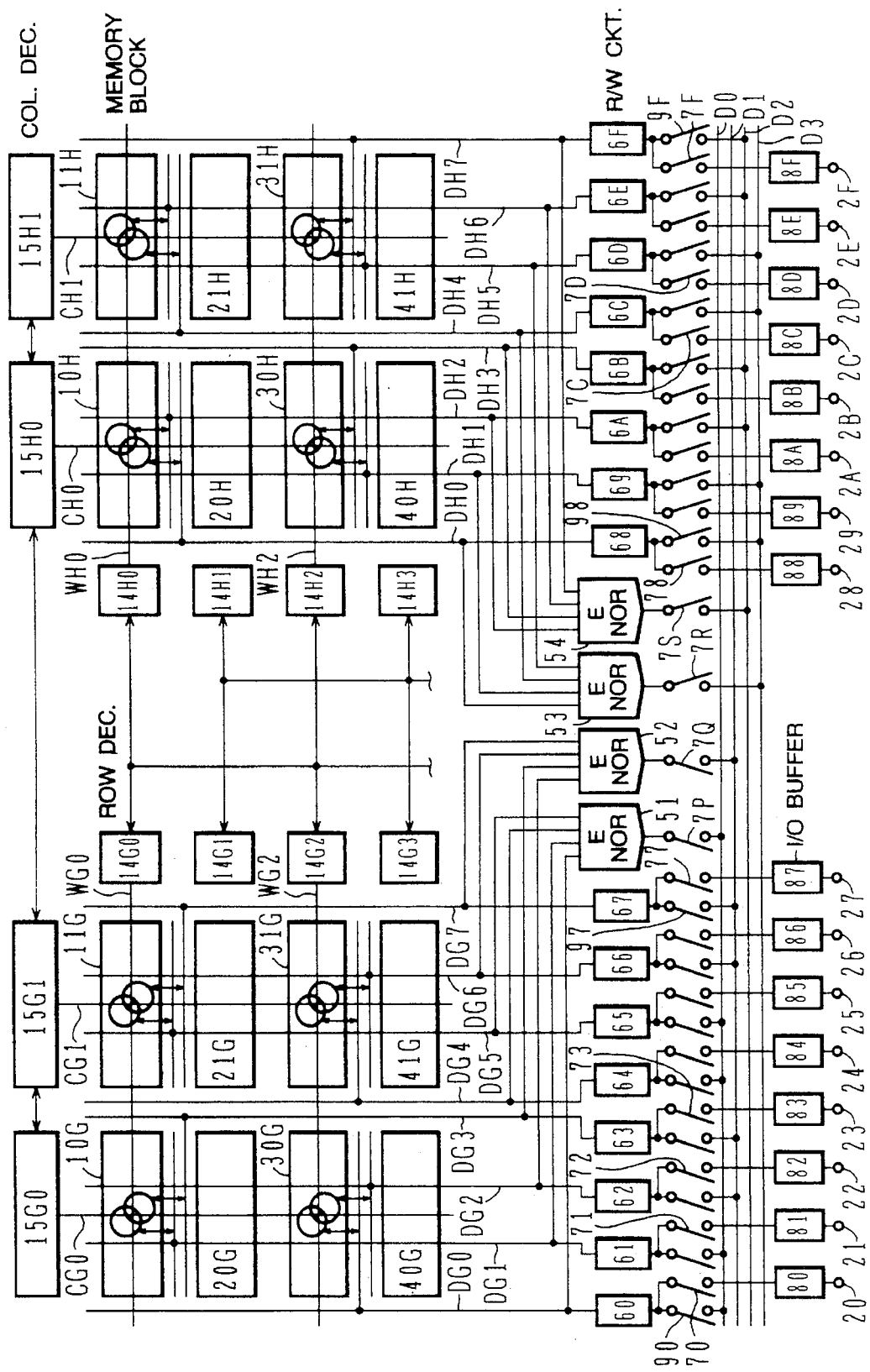
FIG. 5 i is a schematic block diagram of the structure of part of FIG. 4.
Figure 6:
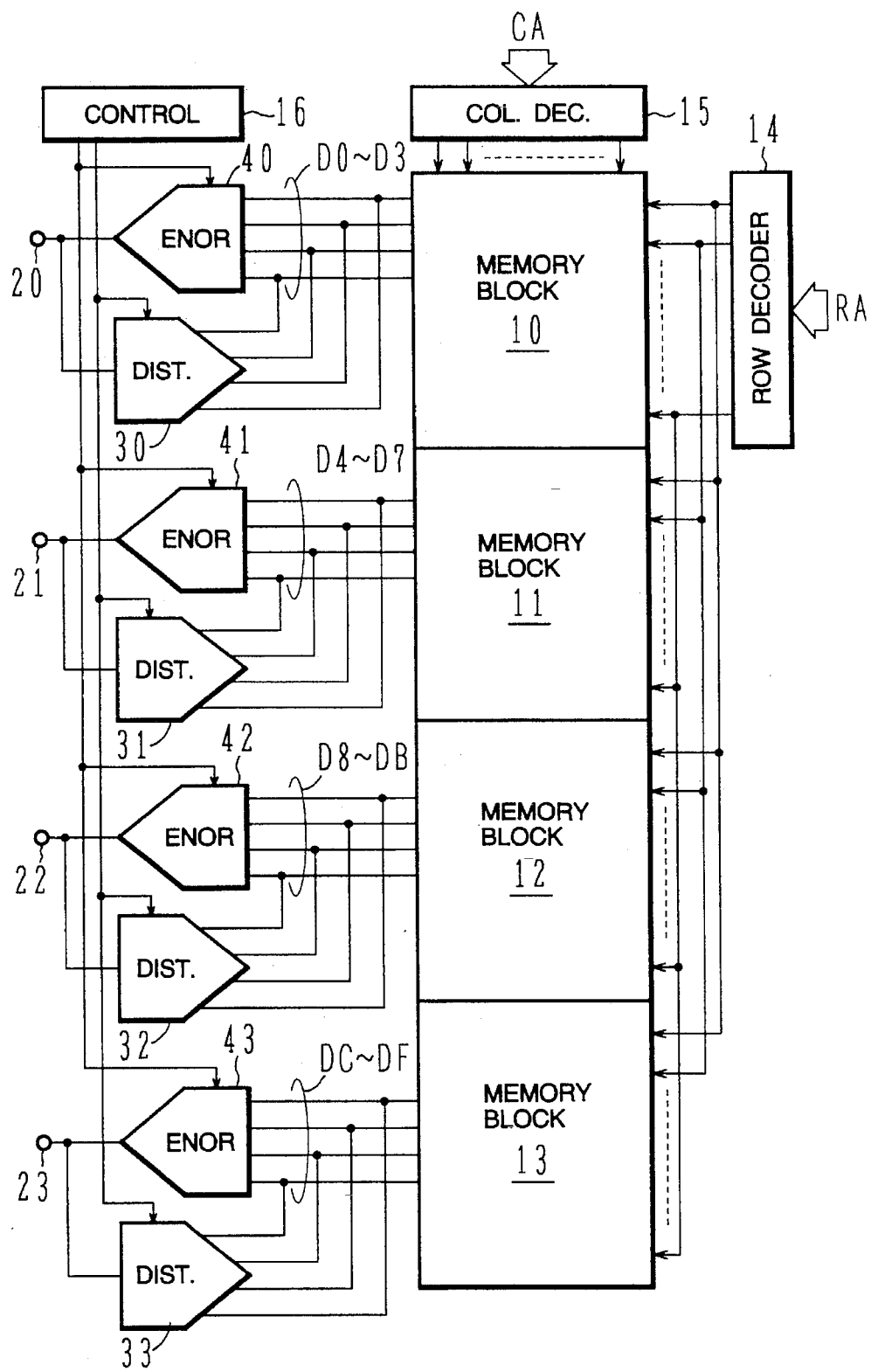
FIG. 6 shows the principle structure of a semiconductor memory device with a data compression function in the prior art.

FIG. 5 shows a schematic structure of part of FIG. 4. In FIG. 5, row decoders 14G0 to 14G3 constitute part of the row decoder 14G shown in FIG. 4 and row decoders 14H0 to 14H3 constitute part of the row decoder 14H shown in FIG. 4, column decoders 15G0 and 15G1 constitute the column decoder 15G shown in FIG. 4 and column decoders 15H0 and 15H1 constitute part of the column decoder 15H shown in FIG. 4. The circular marks indicate representative memory cells in the memory blocks and in correspondence to these, word lines WG0, WG2, WH0 and WH2 and column lines CG0, CG1, CH0 and CH1 are all represented as single lines. In FIG. 5, some of the reference characters assigned to the memory blocks and switch elements are omitted for the sake of simplification.

The memory cells in the corresponding rows in memory blocks 10G, 11G, 30G, 31G, 10H, 11H, 30H and 31H are simultaneously selected by the row decoders 14G0, 14G2, 14H0 and 14H2 via the word lines WG0, WG2, WH0 and WH2 respectively. The corresponding two columns in those selected rows are then simultaneously selected by the column decoders 15G0, 15G1, 15H0 and 15H1 via the column lines CG0, CG1, CH0 and CH1 respectively. Thus, the two bits in each of the memory blocks 10G, 11G, 30G, 31G, 10H, 11H, 30H and 31H at positions that correspond to the positions of the rest of the selected bits, are selected at the same time as the rest.

The bit selection described above for the group of memory blocks 10G, 11G, 30G, 31G, 10H, 11H, 30H and 31H and the bit selection for the group of memory blocks 20G, 21G, 40G, 41G and 20H, 21H, 40H and 41H are performed independently of each other and while a bit selection is performed in one group, bit selection is not performed in the other group.

During a data read, the data at the selected two bits in each of the memory blocks 10G, 11G, 30G, 31G, 10H, 11H, 30H and 31H are taken out on the data lines (DG1, DG3), (DG5, DG7), (DG0, DG2), (DG4, DG6), (DH0, DH2), (DH4, DH6), (DH1, DH3) and (DH5, DH7). While an identical operation is performed when bit selection is made for the group of memory blocks 20G, 21G, 40G, 41G, 20H, 21H, 40H and 41H, for the sake of simplification, the connection relationships in the data flow in that situation is omitted in FIG. 5.

The data lines DG0 to DG7 are connected to the read/write circuits 60 to 67 respectively at one side ends. The other ends of the read/write circuits 60 to 67 are connected to data input/output terminals 20 to 27 via switch elements 70 to 77 and input/output buffer gates 80 to 87 respectively on one side and are also connected to data lines D0, D0, D1, D1, D0, D0, D1 and D1 respectively via switch elements 90 to 97 on the other side. The data lines DH0 to DH7 are connected to the read/write circuits 68, 69 and 6A to 6F respectively at one side ends. The other ends of the read/write circuits 68 to 6F are connected to data input/output terminals 28 to 2F via switch elements 78 to 7F and input/output buffer gates 88 to 8F respectively on one side and are also connected to data lines D3, D3, D2, D2, D3, D3, D2 and D2 respectively via switch elements 98 to 9F on the other side. The data lines DG0, DG1, DG4 and DG5 are connected to the inputs of a matching detection circuit 51, the data lines DG2, DG3, DG6 and DG7 are connected to the inputs of a matching detection circuit 52, the data lines DH0, DH1, DH4 and DH5 are connected to the inputs of a matching detection circuit 53 and the data lines DH2, DH3, DH6 and DH7 are connected to the inputs of a matching detection circuit 54. The outputs of the matching detection circuits 51 to 54 are connected to the data lines D0, D1, D3 and D2 respectively via switch elements 7P to 7S.

The read/write circuits 60, 61, 64 and 65 and switch elements 90, 91, 94 and 95 constitute a distribution circuit corresponding to the matching detection circuit 51. The other distribution circuits are likewise as described above.

Next, the operation of the DRAM structured as described above is explained in reference to FIG. 5.

During a data write in the data compression test mode, the switch elements 70, 72, 7D, 7F and 90 to 9F are turned ON while the remaining switch elements 71, 73 to 7C, 7E and 7P to 7S are turned OFF, the bidirectional read/write circuits 60 to 6F and input/output buffer gates 80 to 8F are set in the direction for data write, and four-bit data are provided to the data input/output terminals 20, 22, 2D and 2F.

The data provided to the data input/output terminal 20 travel through the read/write circuits 60, 61, 64 and 65 to be written at one of the two bits selected in each of the memory blocks 30G, 10G, 31G and 11G respectively. The data provided to the data input/output terminal 22 travel through the read/write circuits 62, 63, 66 and 67 to be written at the other bit of the two bits selected in each of the memory blocks 30G, 10G, 31G and 11G respectively. The data provided to the data input/output terminal 2D travel through the read/write circuits 68, 69, 6C and 6D to be written at one of the two bits selected in each of the memory blocks 10H, 30H, 11H and 31H respectively. The data provided to the data input/output terminal 2F travel through the read/write circuits 6A, 6B, 6E and 6F to be written at the other bit of the two bits selected in each of the memory blocks 10H, 30H, 11H and 31H respectively.

Since two bits or no bits are written in each memory block, and when two bits are written, the data written at one bit are independent of the data written at the other, by performing the write repeatedly, patterns, including those shown in FIG. 9A and FIG. 9B, can be written commonly for each block in the group of the memory blocks 10G, 11G, 30G and 31G and also commonly for each memory block in the group of the memory blocks 10H, 11H, 30H and 31H. As a result, the length of time required for testing is reduced compared to that in the prior art. In addition, since only four data input terminals are required for testing, the number of DRAMs that can be tested at the same time on one tester increases, making it possible to perform testing more efficiently. Note that patterns that are different from each other can be written in the two groups mentioned above.

During a data read in the data compression test mode, the switch elements 70, 72, 7D, 7F, 7P to 7S, 90, 92, 9D and 9F are turned ON, while the remaining switch elements 71, 73 to 7C, 7E, 91, 93 to 9C and 9E are turned OFF and the read/write circuits 60 to 6F and the input/output buffer gates 80, 82, 8D and 8F are set in the direction for data read. The data that are read out from one of the two bits selected in each of the memory blocks 10G 11G, 30G and 31G travel through the matching detection circuit 51, the switch elements 7P, 90 and 70 and the input/output buffer gate 80 to be taken out at the data input/output terminal 20, while the data that are read out from the other bit of the two bits selected in each of the memory blocks 10G, 11G, 30G and 31G travel through the matching detection circuit 52, the switch elements 7Q and 72 and the input/output buffer gate 82 to be taken out at the data input/output terminal 22. The data that are read out from one of the two bits selected in each of the memory blocks 10H, 11H, 30H and 31H travel through the matching detection circuit 53, the switch elements 7R and 7D and the input/output buffer gate 8D to be taken out at the data input/output terminal 2D, while the data that are read out from the other bit of the two bits selected in each of the memory blocks 10H, 11H, 30H and 31H travel through the matching detection circuit 54, the switch elements 7S, 9F and 7F and the input/output buffer gate 8F to be taken out at the data input/output terminal 2F.

During a data write in the normal operating mode, the switch elements 70 to 7F are turned ON while the switch elements 7P to 7S and 90 to 9F are turned OFF, and the read/write circuits 60 to 6F and the input/output buffer gates 80 to 8F are set in the direction for data write. The sixteen-bit data provided to the data input/output terminals 20 to 2F travel through the input/output buffer gates 80 to 8F, the switch elements 70 to 7F and the read/write circuits 60 to 6F respectively to be written at the two bits selected in each of the memory blocks 10G, 11G, 30G, 31G, 10H, 11H, 30H and 31H.

During a data read in the normal operating mode, the switch elements 70 to 7F arc turned ON while the switch elements 7P to 7S and 90 to 9F are turned OFF, and the read/write circuits 60 to 6F and the input/output buffer gates 80 to 8F are set in the direction for data read. The two bits selected in each of the memory blocks 10, 11G, 30G, 31G, 10H, 11H, 30H and 31H travel through the read/write circuits 60 to 6F, the switch elements 70 to 7F and the input/output buffer gates 80 to 8F respectively to be taken out at the data input/output terminals 20 to 2F.

Although a preferred embodiments of the invention has been described in detail, it should be understood that various changes, substitutions and alterations can be made therein without departing from the spirit and scope of the invention as defined by the appended claims.

What is claimed is:

1. A semiconductor memory device including memory blocks, data terminal for data input/output and data lines for said memory blocks, said device comprising:

a matching detection circuit having inputs and an output coupled to said data terminal, each of said inputs being coupled to one of said data lines, said one corresponding to one of said memory blocks;

a distribution circuit having an input coupled to said data terminal and having outputs for outputting data corresponding to data provided to said input of said distribution circuit, said outputs of said distribution circuit being insulated from each other and coupled to said inputs of said matching detection circuit respectively; and a control circuit for invalidating said output of said matching detection circuit and validating said outputs of said distribution circuit during a data write in a data compression test mode, and for validating said output of said matching detection circuit and invalidating said outputs of said distribution circuit during a data read in said data compression test mode.

2. A semiconductor memory device according to claim 1, wherein said distribution circuit includes:

switch elements commonly coupled at first side ends thereof as said input of said distribution circuit and at second ends thereof to said outputs of said distribution circuit.

3. A semiconductor memory device according to claim 2, wherein said distribution circuit further includes:

bidirectional buffer gates coupled at first side ends thereof to said second ends of said switch elements respectively, second ends thereof being as said outputs of said distribution circuit.

4. A semiconductor memory device according to claim 1, wherein a plurality of said data terminals are provided and said distribution circuit includes:

first switch elements commonly coupled at first side ends thereof and at second ends thereof to said outputs of said distribution circuit respectively; and second switch elements coupled at first side ends thereof to said second ends of said first switch elements respectively and at second ends thereof to said data terminals respectively.

5. A semiconductor memory device according to claim 4, wherein said distribution circuit further includes:

bidirectional buffer gates coupled at first side ends thereof to said second ends of said second switch elements respectively and at second ends thereof to said data terminals respectively.

6. A semiconductor memory device according to claim 1, wherein: a plurality of said data terminals, said matching detection circuits and said distribution circuits are provided.

7. A compression testing method for a semiconductor memory device, said device including memory blocks, data terminal for data input/output and data lines for said memory blocks, said device comprising:

a matching detection circuit having inputs and an output coupled to said data terminal, each of said inputs being coupled to one of said data lines, said one corresponding to one of said memory blocks; and a distribution circuit having an input coupled to said data terminal and having outputs for outputting data corresponding to data provided to said input of said distribution circuit, said outputs of said distribution circuit being insulated from each other and coupled to said inputs of said matching detection circuit respectively;

said method comprising the steps of:

invalidating said output of said matching detection circuit and validating said outputs of said distribution circuit during a data write in a data compression test mode; and validating said output of said matching detection circuit and invalidating said outputs of said distribution circuit during a data read in said data compression test mode.

* * * * *